United States Patent [19]

Araki

[11] Patent Number: 5,194,931
[45] Date of Patent: Mar. 16, 1993

[54] MASTER SLICE SEMICONDUCTOR DEVICE

[75] Inventor: Tomokazu Araki, Ooita, Japan

[73] Assignee: Kabushiki Kaisha Toshiba, Kawasaki, Japan

[21] Appl. No.: 819,666

[22] Filed: Jan. 13, 1992

Related U.S. Application Data

[63] Continuation of Ser. No. 505,424, Apr. 5, 1990, abandoned.

[30] Foreign Application Priority Data

Jun. 13, 1989 [JP] Japan .................................. 1-150190

[51] Int. Cl.$^5$ ...................... H01L 23/48; H01L 21/60
[52] U.S. Cl. .................................. 257/734; 257/773; 257/780; 257/784; 257/786
[58] Field of Search ......................... 357/45, 65, 68, 72

[56] References Cited

U.S. PATENT DOCUMENTS

| 4,907,039 | 3/1990 | Chikaki | 357/68 |
| 4,974,052 | 11/1990 | Ichiyama | 357/74 |

FOREIGN PATENT DOCUMENTS

| 57-114246 | 7/1982 | Japan . | |
| 57-114247 | 7/1982 | Japan . | |
| 59-29430 | 2/1984 | Japan . | |
| 59-172757 | 9/1984 | Japan | 357/65 |
| 59-218760 | 12/1984 | Japan . | |
| 60-4249 | 1/1985 | Japan | 357/65 |
| 61-19136 | 1/1986 | Japan . | |
| 61-81644 | 4/1986 | Japan . | |
| 62-13043 | 1/1987 | Japan | 357/45 |

OTHER PUBLICATIONS

Gaensslen et al., "High-density contact design", IBM TDB vol. 14, No. 2, Jul./71, p. 570.

Primary Examiner—Eugene R. LaRoche
Assistant Examiner—Viet Q. Nguyen
Attorney, Agent, or Firm—Finnegan, Henderson, Farabow, Garrett and Dunner

[57] ABSTRACT

A bonding pad to be bonded to a lead electrode is formed to have an opening with a substantially square plane shape, and a bonding pad which is not to be bonded to a lead electrode is formed to have an opening with a substantially square plane shape with a notched position in the center. The outer shapes of the electrode pads are varied in accordance with packages which contain semiconductor chip.

10 Claims, 3 Drawing Sheets

MASTER SLICE SEMICONDUCTOR DEVICE

This application is a continuation of application Ser. No. 07/505,424 filed Apr. 5, 1990, now abandoned.

BACKGROUND OF THE INVENTION

1. Field of the Invention

The present invention relates to assembly master slice semiconductor devices contained in different types of packages and, more particularly, to a semiconductor device using a master slice approach which allows easy identification of bonding pads which can fit specific type of package when bonding wires are connected to the bonding pads.

2. Description of the Related Art

A semiconductor integrated circuit device (to be referred to as an LSI hereinafter) using an assembly master slice approach as a conventional method to improve the developing and production efficiencies o an LSI is known. In this approach, a large number of basic units such as transistors and gate circuits are formed on a semiconductor chip in advance, and wiring layers between the basic units are formed using a mask for forming wiring layers in the final step in the manufacturing process. Therefore, an LSI having a desired function can be manufactured within a short period of time.

In an LSI, e.g., 1M- or 4M-byte DRAM (dynamic random access memory) manufactured by the assembly master slice approach, electric pads called bonding pads are also formed by the master slice approach to be contained in various packages such as of DIP (dual in-line package) type, SOJ (small out-line J lead) type, or ZIP (zigzag in-line package) type. More specifically, bonding pads having the same outer shape are previously formed at positions which fit different types of packages, and surface protective films each consisting of, e.g., an insulating film, are deposited on the bonding pads, respectively. Thereafter, openings for bonding are formed in the surface protective films at all the bonding pad positions using a common mask which fits the different types of packages. Thereafter, only the bonding pads which fit a specific type of package are connected to lead electrodes called inner leads using bonding wires. Therefore, in the LSI of this type, bonding pads which are not bonded are present besides the pads bonded to the lead electrodes.

FIG. 1 is a plan view of a conventional LSI in a ZIP type package. In a peripheral portion of a chip 12 sealed in a package 11, a plurality of bonding pads 13 are arranged in advance at positions which fit different types of packages. As shown in FIG. 1, in the ZIP type package, the bonding pads 13 arranged among three sides of the chip 12 are connected to inner leads 15 through bonding wires 14, respectively.

FIG. 2 is a plan view of a conventional LSI of an SOJ type package. As shown in FIG. 2, in a package 16 of an SOJ type, the bonding pads 13 which are arranged along the two opposite sides of the chip 12 are connected to the inner leads 15 through the bonding wires 14, respectively.

FIG. 3 is a plan view of the chip 12 commonly used for the ZIP type LSI shown in FIG. 1 and the SOJ type LSI shown in FIG. 2. In FIG. 3, a region A hatched by lines inclined from the upper left direction to the lower right direction serves as a pad region for the ZIP type package, and regions B hatched by lines inclined from the upper right direction to the lower left direction serve as pad regions for the SOJ type package. As shown in FIG. 3, the regions A and B partially overlap each other.

The above-mentioned bonding operation is often performed using a self-teaching bonding apparatus. In this apparatus, an operator observes the positions of the bonding pads 13 and the inner leads 15 by a microscope, and sets the bonding positions in the bonding apparatus with reference to a diagram of the bonding positions.

In the conventional semiconductor device using the master slice approach, however, the bonding pads 13 having the same outer shape are arranged on a chip to fit the different types of packages. Therefore, an operator may misidentify pads to be bonded and pads not to be bonded upon observation using a microscope.

SUMMARY OF THE INVENTION

The present invention has been made in consideration of the above situation, and has as its object to provide a semiconductor device using the master slice approach which allows easy identification of pads to be bonded and pads not to be bonded.

According to the present invention, there is provided a semiconductor device using the master slice approach wherein bonding pads which are bonded to lead electrodes are formed to having openings with a substantially square planar shape, and bonding pads which are not to be bonded to the lead electrodes are formed having, an opening with a substantially square plane shape and a notch in the center. The outer shape of the bonding pad can be changed depending on the packages which contain the semiconductor chip.

In the semiconductor device of the present invention, in the bonding pads arranged on a semiconductor chip, the shapes of the bonding pads to be bonded are different from those of the bonding pads which are not to be bonded depending on the types of packages so that an operator can easily identify whether the bonding pads are to be bonded.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described embodiments of this application with reference to the accompanying drawings.

A semiconductor device using the master slice approach according to the present invention is manufactured as follows. On a semiconductor chip, bonding pads are formed at positions which fit different types of packages, and surface protective films are respectively deposited on the bonding pads. Thereafter, openings for bonding are respectively formed in the surface protective films at all the bonding pad positions using a common mask which can be used for the different types of packages. Before the semiconductor chip is sealed in the specific type of package, only required bonding pads are connected to corresponding inner leads. In the present invention, the outer shape of bonding pads to be connected to the inner leads is different from that of the bonding pads not to be connected to the inner leads, depending on the types of packages which contain the chips.

An embodiment of the present invention will be described hereinafter with reference to the accompanying drawings.

Figure 1:
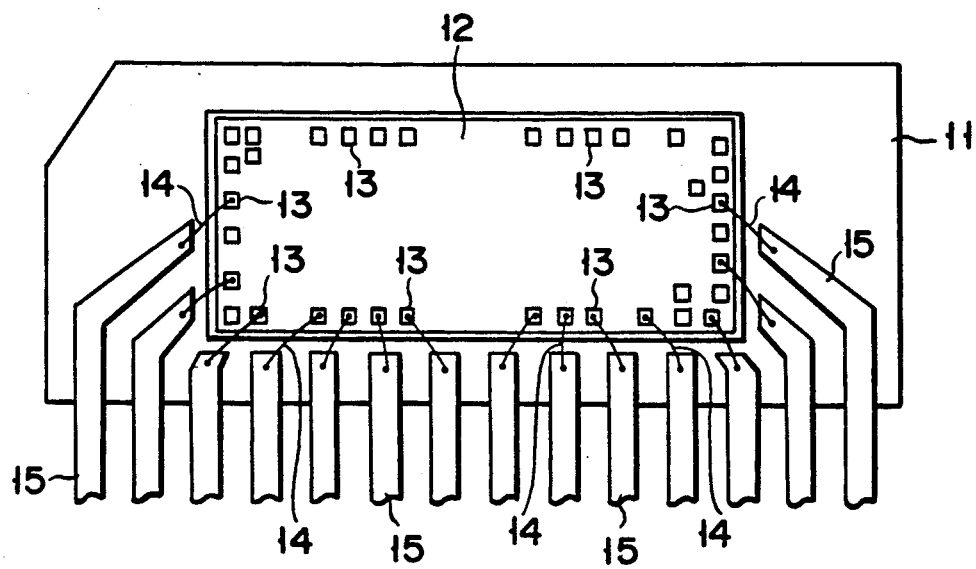
FIG. 1 is a plan view showing an arrangement of a conventional semiconductor chip manufactured in an LSI using the master slice assembly approach.
Figure 2:
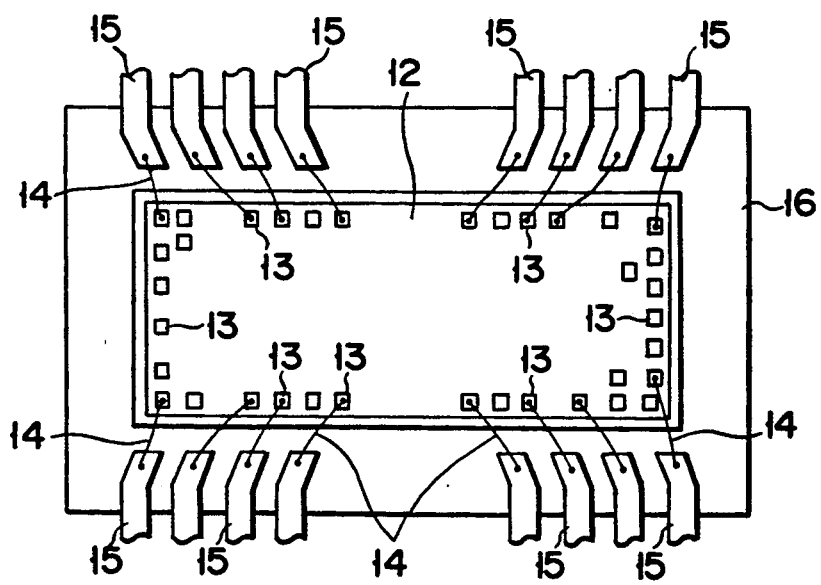
FIG. 2 is a plan view showing an arrangement of another conventional semiconductor chip manufactured in an LSI using the master slice assembly approach.
Figure 3:
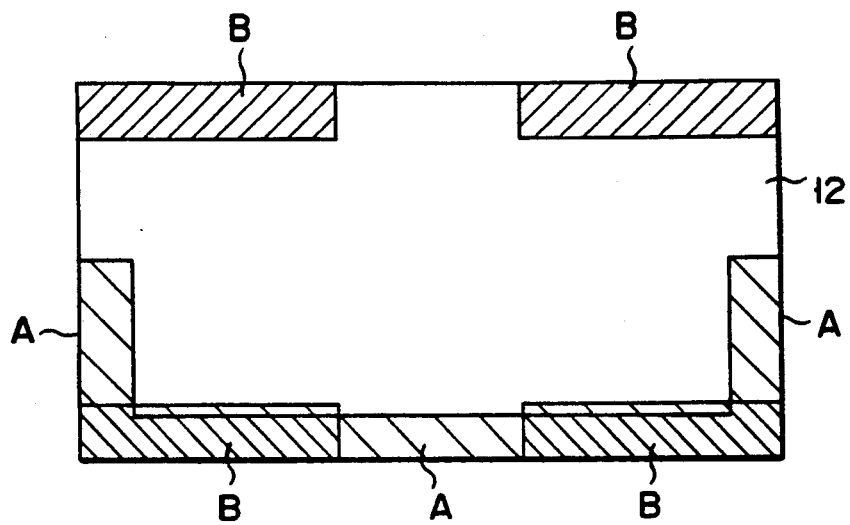
FIG. 3 is a plan view showing regions of bonding pads respectively used in FIGS. 1 and 2.
Figure 4A:
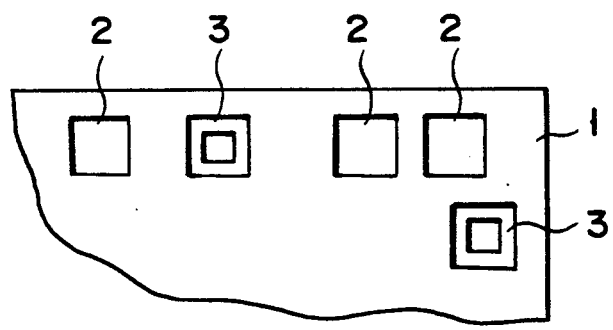
FIG. 4A is a plan view showing an arrangement of a semiconductor device according to an embodiment of the present invention.

FIG. 4A is a plan view showing an arrangement of a semiconductor device according to an embodiment of the present invention. FIG. 4A shows a semiconductor chip to be contained in a given type of package. A plurality of bonding pads are arranged on a semiconductor chip 1. The outer shape of each bonding pad 2 to which a corresponding bonding wire is connected is different from that of each bonding pad 3 to which no bonding wire is connected.

Figure 4B:
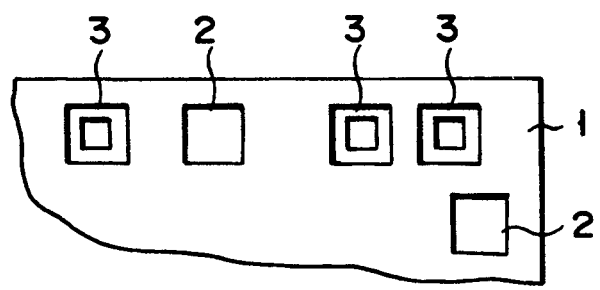
FIG. 4B is a plan view showing an arrangement of a semiconductor device according to another embodiment of the present invention.

FIG. 4B is a plan view showing an arrangement of a semiconductor device according to another embodiment of the present invention. FIG. 4B shows a semiconductor chip to be contained in different type of package from the shown in FIG. 4A. A plurality of bonding pads are also arranged on a semiconductor chip 1 in this embodiment. The outer shape of each bonding pad 2 to which a corresponding bonding wire is connected is different from that of each bonding pad 3 to which no bonding wire is connected.

Figure 5A:
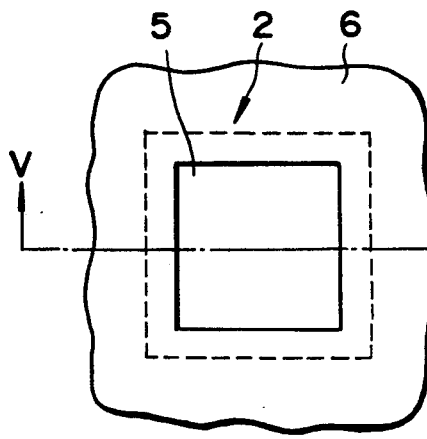
FIG. 5A is a plan view showing a detailed arrangement of bonding pads 2 shown in FIGS. 4A and 4B.
Figure 6A:
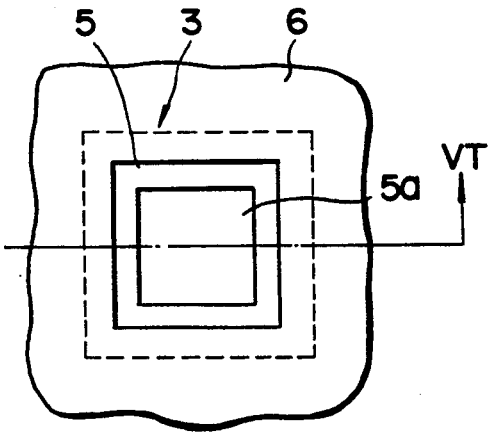
FIG. 6A is a plan view showing a detailed arrangement of bonding pads 3 shown in FIGS. 4A and 4B.
Figure 5B:
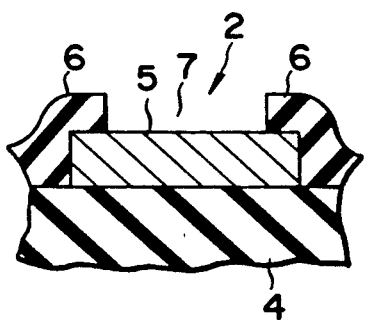
FIG. 5B is a sectional view taken along the line V—V in FIG. 5A.
Figure 6B:
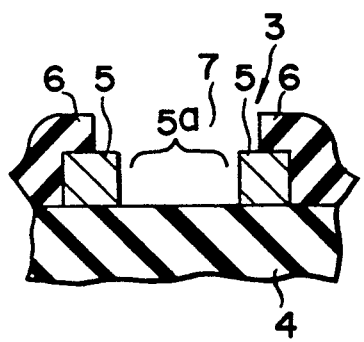
FIG. 6B is a sectional view taken along the line VT—VT in FIG. 6A.

FIGS. 5A and 5B show a detailed arrangement of the bonding pad 2 to which the bonding wire is connected in FIGS. 4A and 4B, in which FIG. 5A is a plan view of the bonding pad 2, and FIG. 5B is a sectional view taken along line V—V in FIG. 5A. FIGS. 6A and 6B show a detailed arrangement of the bonding pad 3 to which no bonding wire is connected in FIGS. 4A and 4B, in which FIG. 6A is a plan view of the bonding pad 3, and FIG. 6B is a sectional view taken along the line VI—VI in FIG. 6A.

Referring to FIGS. 5A and 5B and 6A and 6B reference numeral 4 denotes an insulating interlayer film which consists of, e.g., a silicon oxide, and is formed on the surface of the semiconductor chip. A bonding pad 5 is formed on the insulating interlayer film 4. The bonding pad 5 is formed by depositing a conducting layer consisting of, e.g., aluminum on the entire surface of the insulating interlayer film 4, and patterning the resultant aluminum layer. A passivation film 6 consisting of an insulating film of PSG (phospho-silicate glass), PSiN (plasma silicon nitride) or the like is deposited on the entire surface including the bonding pad 5. Openings 7 for bonding are formed in the passivation film 6 to correspond to bonding pad positions by the PEP (photoengraving process) using a common mask which fits different types of packages. The bonding pad 2 is formed to have a substantially square planar shape, as shown in FIG. 5A. In contrast to this, as shown in FIG. 6A, the bonding pad 3 is formed to have a substantially square planar shape with a notched portion, i.e., a hollow portion, 5a, e.g., in the center. The lower insulating interlayer film 4 is exposed through the hollow portions 5a.

Thus, the outer shape of the bonding pad 2 is different from that of the bonding pad 3. For this reason, when a bonding operation is performed using a self-teaching bonding apparatus, an operator can easily identify the bonding pad 2 to be bonded from the bonding pad 3 not to be bonded by a microscope, thus substantially preventing misidentification of the bonding pads.

In addition, even if an operator erroneously identifies bonding pads and thereafter bonding wires are connected to the bonding pads which are not to be bonded by a bonding apparatus, the lower insulating interlayer film 4 is exposed through the hollow portion 5a in the bonding pad 3, as shown in FIGS. 6A and 6B, and thus the connection states of the bonding wires are insufficient. Therefore, these portions can be detected as defective portions upon a bonding precision test which is normally performed after the bonding operation.

The bonding pads 2 and 3 respectively shown in FIGS. 5A and 5B and FIGS. 6A and 6B are formed in the following manner. First, the insulating interlayer film 4 is deposited on the surface of the semiconductor chip 1. Then, a conducting layer such as an aluminum layer is deposited on the entire surface of the insulating interlayer film 4 by vacuum evaporation. When the aluminum layer is patterned using a mask depending on the types of packages, the bonding pads each having a shape shown in FIGS. 5A and 5B or FIGS. 6A and 6B are simultaneously formed. It is determined whether the hollow portion 5a is formed in each bonding pad in accordance with selection of a mask performed when the aluminum layer is deposited to form the bonding pad. Sequentially, the passivation film 6 is deposited on the entire surface. Then, the openings 7 for bonding are formed at each bonding pad position by selective etching using a mask which is common for all packages.

Note that the shape of the bonding pad which allows easy identification of bonding pads to be bonded and bonding pads not to be bonded is not limited to the above embodiments, and various methods can be employed, as a matter of course. For example, although the planar shape of the hollow portion 5a is square in the above embodiments, the portion 5a having an arbitrary shape such as a circle or a triangle can be formed. In addition, the size of the hollow portion 5a can also be changed within a range which allows for identification, as needed. Although a case wherein an opening is formed in the passivation film 6 using a mask for forming an opening in the bonding pad which is common for the bonding pad 2 to be bonded and the bonding pad 3 not to be bonded has been described above, different masks for forming openings in the bonding pads may be used. Therefore, when the shape of the bonding pad can be easily identified by an operator, misidentification by the operator can be prevented.

As described above, according to the present invention, there is provided a semiconductor device using the master slice approach which allows easy identification of bonding pads to be bonded and bonding pads not to be bonded.

Additional advantages and modifications will readily occur to those skilled in the art. Therefore, the invention in its broader aspects is not limited to the specific details, representative devices shown and described herein. Accordingly, various modifications may be made without departing from the spirit or scope of the general inventive concept as defined by the appended claims and their equivalents.

What is claimed is:

1. A method of forming a master slice semiconductor device including the steps of:
    forming bonding pads, on a surface of the semiconductor device at predetermined positions which fit different types of packages;
    depositing a surface protective film on the surface of the semiconductor device;
    forming openings for bonding in said surface protective film at the predetermined positions using a common mask which fits the different types of packages; and
    bonding only certain of the bonding pads, when said semiconductor device is contained in a specific type of package, to corresponding lead electrodes of the specific type of package, wherein
    the step of forming bonding pads includes the steps of:
        shaping the certain bonding pads to be bonded to the corresponding lead electrodes with an opening in said surface protective film;
        notching the remaining bonding pads which are not to be bonded to the corresponding lead electrodes with an opening in the center of said bonding pads having a surrounding continuous planar notched portion; and
        exposing the insulating interlayer film through the continuous planar notched portion of the bonding pads which are not to be bonded to the lead electrodes.

2. The method of forming a semiconductor device according to claim 1, wherein the notching step further includes notching the bonding pads into the continuous planar notched portion of a square shape.

3. The method of forming a semiconductor device according to claim 1, wherein the notching step further includes notching the bonding pads into the continuous planar notched portion of a circular shape.

4. The method of forming a semiconductor device according to claim 1, wherein the notching step further includes notching the bonding pads into the continuous planar notched portion of a triangular shape.

5. The method of forming a semiconductor device according to claim 1, wherein the step of forming openings for bonding further includes exposing only a portion of each of the bonding pads.

6. A master slice semiconductor device comprising:
    a semiconductor chip;
    an insulating interlayer film formed on a surface of the semiconductor chip;
    a plurality of bonding pads, including first and second bonding pads, formed on the insulating interlayer film at predetermined positions which fit different types of device mounting packages, the second bonding pad having a continuous planar notched portion therein exposing the interlayer insulator film;
    a surface protective film formed on the surface of the semiconductor device; and
    a plurality of openings for bonding, including first and second openings, formed in the surface protective film at predetermined positions using a common mask which fits the different types of device mounting packages;
    wherein the first opening is formed above the first bonding pad, and the second opening is formed above the second bonding pad exposing the planar notched portion; and
    wherein the first bonding pad is for bonding to a corresponding lead electrode of a specific type of device mounting package when the semiconductor device is contained in the specific type of package and the second bonding pad is for not bonding to any lead electrode of the specific type of package.

7. The semiconductor device according to claim 6, wherein the shape of the continuous planar notched portion is square.

8. The semiconductor device according to claim 6, wherein the shape of the continuous planar notched portion is circular.

9. The semiconductor device according to claim 6, wherein the shape of the continuous planar notched portion is triangular.

10. The semiconductor device according to claim 6, wherein the openings for bonding expose only a portion of each of the plurality of bonding pads.

* * * * *